(12) United States Patent
Petersen

(10) Patent No.: US 11,545,164 B2
(45) Date of Patent: Jan. 3, 2023

(54) AUDIO SIGNAL ENCODING AND DECODING

(71) Applicant: RTX A/S, Nørresundby (DK)

(72) Inventor: Jens Toftgaard Petersen, Svenstrup J (DK)

(73) Assignee: RTX A/S, Nørresundby (DK)

( * ) Notice: Subject to any disclaimer, the term of this patent is extended or adjusted under 35 U.S.C. 154(b) by 59 days.

(21) Appl. No.: 16/619,039

(22) PCT Filed: Jun. 15, 2018

(86) PCT No.: PCT/DK2018/050142
§ 371 (c)(1),
(2) Date: Dec. 3, 2019

(87) PCT Pub. No.: WO2018/233788
PCT Pub. Date: Dec. 27, 2018

(65) Prior Publication Data
US 2020/0090672 A1    Mar. 19, 2020

(30) Foreign Application Priority Data

Jun. 19, 2017 (DK) .................. PA 2017 70475

(51) Int. Cl.
*G10L 19/005* (2013.01)
*G10L 19/035* (2013.01)
*G10L 19/08* (2013.01)

(52) U.S. Cl.
CPC .......... *G10L 19/035* (2013.01); *G10L 19/005* (2013.01); *G10L 19/08* (2013.01)

(58) Field of Classification Search
CPC ..... G10L 19/035; G10L 19/005; G10L 19/08; H03M 7/3049; H03M 7/3044; H03M 3/04;

(Continued)

(56) References Cited

U.S. PATENT DOCUMENTS 5,699,484 A    12/1997  Davis
6,578,162 B1 *  6/2003  Yung ............... G10L 19/02
                                                  375/244

(Continued)

FOREIGN PATENT DOCUMENTS

JP    H-10511243 A    10/1998
JP    2003316391 A    11/2003

(Continued)

OTHER PUBLICATIONS

Office Action dated Dec. 10, 2020 in JP Application No. 2019-565426 (w/English-language translation), 10 pages.

(Continued)

*Primary Examiner* — Thomas H Maung
(74) *Attorney, Agent, or Firm* — Muncy, Geissler, Olds & Lowe, P.C.

(57) ABSTRACT

An audio codec suitable for robust wireless transmission of high quality audio with low latency, still at a moderate bit rate. The encoding and decoding methods are based on ADPCM and in addition to the encoded output bits APM, additional data QB are included in output data blocks, namely data QB representing an internal value of the adaptive quantization ADQ of the ADPCM encoding algorithm, especially a scaling factor encoded and truncated to such as 8 bits. Further, output data blocks preferably include data CFB representing an internal value of the predictor PR of the ADPCM encoding algorithm, especially data CFB representing coefficients of a lattice prediction FIR filter which, truncated to such as 8 bits, can be sequentially included in output data blocks. These additional data QB, CFB regarding internal values of the ADPCM encoding algorithm can be utilized at the encoder side to increase robustness against loss of data blocks in wireless transmission. Especially, the decoding algorithm may comprise comparing its current internal ADPCM decoding values corresponding to the (Continued)

received internal values QB, CFB from the encoder, and in case there is a difference, the decoder can adapt or overwrite its internal values to the ones received QB, CFB. This helps to ensure fast recovery after lost data blocks, thereby ensuring robustness against artefacts in the reconstructed signal, e.g. clicks in case of audio.

7 Claims, 3 Drawing Sheets

(58) Field of Classification Search
CPC .......... H03M 3/042; G06F 3/16; G06F 3/162; G06F 3/165; G10H 2250/595
See application file for complete search history.

(56) References Cited

U.S. PATENT DOCUMENTS

| | | | | |
|---|---|---|---|---|
| 6,714,908 | B1* | 3/2004 | Naka | G10L 19/005 |
| | | | | 341/94 |
| 7,272,554 | B2 | 9/2007 | Serizawa et al. | |
| 2007/0091873 | A1* | 4/2007 | LeBlanc | H04B 3/23 |
| | | | | 370/352 |
| 2008/0046233 | A1* | 2/2008 | Chen | G10L 19/005 |
| | | | | 704/211 |
| 2010/0183092 | A1* | 7/2010 | Lien | H03M 3/042 |
| | | | | 375/300 |
| 2011/0260893 | A1* | 10/2011 | Sato | G10L 19/04 |
| | | | | 341/51 |
| 2013/0051579 | A1* | 2/2013 | Craven | H03M 3/042 |
| | | | | 381/98 |
| 2015/0200748 | A1* | 7/2015 | Shibuta | H03M 13/09 |
| | | | | 375/254 |
| 2017/0330577 | A1* | 11/2017 | Johnston | G10L 19/04 |
| 2018/0277130 | A1* | 9/2018 | Johnston | G10L 19/008 |
| 2019/0392847 | A1* | 12/2019 | Vasilache | G10L 19/008 |

FOREIGN PATENT DOCUMENTS

| | | |
|---|---|---|
| JP | 2008294990 A | 12/2008 |
| WO | WO 99/31838 A1 | 6/1999 |

OTHER PUBLICATIONS

Shetty et al, "Improving the Robustness of the G.722 Wideband Speech Codec to Packet Losses for Voice Over Wlans"; 2006 IEEE International Conference on Acoustics, Speech And Signal Processing, Toulouse, France , May 14-19, 2006, Piscataway, NJ, p. V-365-V-368 (XP-031016040).

Holters, Martin et al. "Delay-Free Audio Coding Based on ADPCM and Error Feedback"; 11th International Conference on Digital Audio Effects (DAFx-08), Sep. 1-4, 2008, Espoo, Finland, ;pp. 221-225.

G 722, "ITU-T G.722 7 kHz audio-coding within 64 kbit/s"; Sep. 16, 2012, pp. 1-262, [Retrieved on Oct. 20, 2014-] <URL:http://www.itu.int/ITU-T/recommendations/rec.aspx?rec=11673> (XP-055147503).

* cited by examiner

| Log2(Q) | Coef[0] | ADPCM block |
|---|---|---|
| Log2(Q) | Coef[1] | ADPCM block |
| Log2(Q) | Coef[2] | ADPCM block |
| Log2(Q) | Coef[3] | ADPCM block |
| Log2(Q) | Coef[N] | ADPCM block |

US 11,545,164 B2

AUDIO SIGNAL ENCODING AND DECODING

FIELD OF THE INVENTION

The present invention relates to the field of audio transmission and audio codecs. Especially the invention relates to the field of wireless transmission of high quality digital audio signals with low latency and high immunity against packet loss, such as for audio signals from microphones and musical instruments in a live performance.

BACKGROUND OF THE INVENTION

Real-time bidirectional audio applications like headsets, microphones and monitor speakers typically requires communications system with minimum latency. When digital transmission with limited bit rate is desired, for example for wireless transmission, the constraints on the audio coding schemes are tight. For such applications, sample by sample coding schemes based on Adaptive Differential Pulse Code Modulation (ADPCM) provides attractive low latency. However, wireless transmission systems are subject to transmission errors and data loss. The audio encoding scheme has to handle such events in a proper way and to minimize disturbance as much as possible.

Currently, it is usual practice to accept longer latency by used compression algorithms. To use less compression, i.e. more bits per sample, to obtain a rather poor quality, i.e. less SNR at give bitrate, and to accept more artifacts caused by packet loss.

SUMMARY OF THE INVENTION

Thus, according to the above description, it is an object of the present invention to provide a method for encoding an input signal which is both robust against imperfect transmission, such as in wireless transmission, and yet has a low latency.

In a first aspect, the invention provides a method for encoding a digital input signal, the method comprising
  applying an Adaptive Differential Pulse Code Modulation (ADPCM) encoding algorithm to a time block of the digital input signal, the ADPCM encoding algorithm involving adaptive quantization according to a quantizer and a prediction according to a predictor, and generating ADPCM data bits accordingly,
  generating at least one data bit representing an internal value of the adaptive quantization, and
  generating a digital data block comprising said at least one data bit representing the internal value of the adaptive quantization, and the ADPCM data bits.

Such method allows low latency compression e.g. of digital audio signals, and the method is at the same time robust with respect to handling of loss of data blocks in connection with wireless transmission, e.g. to obtain a minimum of audible artefacts in case of transmission errors or loss of data blocks. Due to the additional data included in the data blocks, the method allows adapting the corresponding internal adaptive quantization value to the value represented in the data block at the decoder side, thereby allowing faster adaptation after transmission errors or completely missing data blocks handling ominimum of audible artefacts. This effect can be obtained with a minimum of extra bits in each data block, e.g. included as a header in an ADPCM data block, and thus allows an efficient improvement of performance of e.g. wireless microphones or wireless musical instrument transmitters for live performances.

In further improved embodiments, additional information can be added to the data blocks in the form of data representing an internal value of the prediction part of the ADPCM encoding. E.g. by including prediction filter coefficient, the decoder can adapt faster after transmission errors and prevent filter instability issues and/or allow use of prediction filters with less leakage.

In the following, preferred features and embodiments of the invention will be described.

The at least one data bit representing the internal value of the adaptive quantization may especially represents a logarithmic encoded version of the internal value of the adaptive quantization, e.g. a log 2 encoding of the internal value of the adaptive quantization. Especially, the least one data bit may represent a truncated version of the logarithmic encoded version of the internal value of the adaptive quantization, such as a scaling factor forming part of the adaptive quantization. E.g. a scaling factor used in relation to an envelope estimator of the adaptive quantization.

The at least one data bit representing an internal value of the adaptive quantization may comprise 4-12 bits, e.g. 8 bits in each data block.

The prediction may involve a predictor based on a Finite Impulse Response filter, preferably a lattice Finite Impulse Response filter, wherein the Finite Impulse Response filter has a plurality of Finite Impulse Response filter coefficients.

The method may further comprise generating at least one data bit representing an internal value of the prediction of the Adaptive Differential Pulse Code Modulation encoding algorithm, and generating a digital data block comprising said at least one data bit representing the internal value of the adaptive quantization, said at least one data bit representing the internal value of the prediction, and the Adaptive Differential Pulse Code Modulation data bits. Especially, in embodiments with a lattice FIR filter in the prediction part, the at least one data bit may represent a truncated version of at least one of said Finite Impulse Response filter coefficients. Especially, the at least one data bit representing the internal value of the prediction is comprised in a stream of digital data blocks in a multiplexed manner. Specifically, each digital data block may comprise data bits generated in response to a truncated version of one single one of the plurality of FIR filter coefficients. Especially, each filter coefficient may be truncated to the 4-12 most significant bits, e.g. the 8 most significant bits.

The method may be performed by a processor having a fixed point processor architecture. For this use, the method may comprise adding dither noise to the digital input signal prior to applying the ADPCM encoding algorithm.

The method may comprise transmitting the digital data block represented as a wireless radio frequency signal, such as a DECT, Bluetooth, Bluetooth LE, WiFi, 2.4 GHz ISM band, 5.8 GHz ISM or digital UHF wireless signal.

It is to be understood that the method preferably comprises encoding consecutive time blocks of the digital input signal and accordingly generating consecutive digital data blocks each comprising at least one data bit representing the internal value of the adaptive quantization, and the ADPCM data bits, thereby allowing wireless live audio streaming with low latency.

The method has been found to be highly suitable for audio, and thus in an embodiment, the digital input signal is a digital audio signal.

In a second aspect, the invention provides a method for decoding an ADPCM encoded digital signal according to an ADPCM decoding algorithm involving adaptive quantization according to a quantizer and a prediction according to a predictor, the method comprising receiving a digital data block comprising at least one data bit representing an internal value of an adaptive quantization involved in an ADPCM encoding algorithm, and ADPCM data bits, adjusting an internal value of the adaptive quantization involved in the ADPCM decoding algorithm in accordance with the received at least one data bit representing the internal value of the adaptive quantization involved in an ADPCM encoding algorithm, in case a difference of more than a predetermined threshold between said internal value and the value represented by the at least one data bit is detected, and generating a digital output signal according to the received ADPCM data bits.

Utilizing the received at least one data bit representing the internal value of the ADPCM encoding at the decoder side, it is possible to reduce the effect of errors e.g. if the data blocks are received over a wireless radio frequency transmission channel. Preferably, the method comprises receiving a wireless radio frequency signal with the digital data block represented therein, and detecting if the data block has been received with an error. If it is detected that the data block has been received with an error, it may be preferred to set an output of an adaptive inverse quantizer (an output of a de-quantize codebook) involved in the adaptive quantization to zero. Further, or alternatively, it may be preferred to adjust a leakage in the predictor, such as setting a leakage to zero in the predictor, if it is detected that the data block has been received with an error.

In a third aspect, the invention provides an encoder device comprising an encoder arranged to encode a digital input signal and to generate a digital data block in accordance with the method according to the first aspect. Especially, the encoder device may comprise a wireless radio frequency transmitter arranged to transmit a radio frequency signal representing the digital data block generated by the encoder. The encoder and the wireless radio frequency transmitter may be arranged within the same housing or as separate components.

In a fourth aspect, the invention provides a decoder device comprising a decoder arranged to decode a received digital data block in accordance with the method according to the second aspect. Especially, the decoder device may comprise a wireless radio frequency receiver arranged to receive a radio frequency signal representing the digital data block. The decoder and the wireless radio frequency receiver may be arranged within the same housing or as separate components.

In a fifth aspect, the invention provides a system comprising an encoder arranged to encode a digital input signal and to generate a digital data block in accordance with the method according to the first aspect, a wireless radio frequency transmitter arranged to transmit a radio frequency signal representing the digital data block generated by the encoder, a wireless radio frequency receiver arranged to receive the radio frequency signal representing the digital data block generated by the encoder, and a decoder arranged to decode the received digital data block in accordance with the method according to the second aspect.

Especially, the system may comprise an audio source, such as a microphone arranged to generate a digital input signal in accordance with an acoustic input.

In a sixth aspect, the invention provides a computer program product having instructions which, when executed, cause a computing device or system comprising a processor to perform the method according to the first aspect.

In a seventh aspect, the invention provides a computer program product having instructions which, when executed, cause a computing device or system comprising a processor to perform the method according to the second aspect.

The mentioned computer program products may be: a program product for a dedicated device, or a stand-alone software product for a general computer. It is to be understood that the computer program product instructions in the form of program code which may be implemented on any processing platform, e.g. a dedicated audio device, a general processor in a computer device, e.g. in the form of a downloadable application for a programmable device.

Especially, the computer program products of the sixth and seventh aspects may be stored on a computer readable medium or stored in an electronic chip. E.g. the program code can be implemented in a Central Processor Unit, a Digital Signal Processor or a Field-Programmable Gate Array.

The areas of application of all aspects of the invention are such as: wireless headsets (e.g. gaming headsets), wireless microphones (e.g. stage microphones), wireless line extenders or interfaces (e.g. for musical instruments), wireless speakers, wireless intercom systems.

It is appreciated that the same advantages and embodiments described for the first aspect apply as well for the second, third, fourth, fifth, sixth and seventh aspects. Further, it is appreciated that the described embodiments can be intermixed in any way between all the mentioned aspects.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

Figure 1:
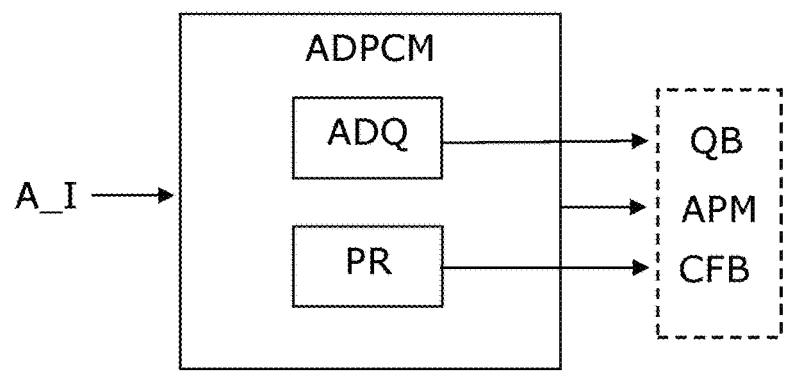
FIG. 1 illustrates a simple block diagram of an encoding method embodiment.

FIG. 1 shows a block diagram illustrating in simple form the ADPCM encoding method embodiment for encoding a digital input signal A_I, e.g. a digital audio signal, according to the invention. A time block of the digital input signal A_I is applied to an Adaptive Differential Pulse Code Modulation ADPCM encoding algorithm involving adaptive quantization ADQ according to a quantizer and a prediction PR according to a predictor. In response, ADPCM data bits APM are generated, these data bits APM allowing a decoder to decode the data bits APM and generate a replica of the digital input signal in response. Further, the encoding method comprises generating at least one data bit QB representing an internal value of the adaptive quantization ADQ. Still further, the encoding method comprising generating at least one data bit CFB representing an internal value of the prediction PR of the ADPCM algorithm.

Thus, additional data bits QB, CFB representing internal values of the encoding algorithm are generated apart from the ADPCM data bits APM themselves, and all of these data QB, CFB, APM are included in a digital data block (dashed box) which is then output, e.g. to a wireless radio frequency transmitter which transmits the data block to a decoder.

These extra data bits QB, CFB representing internal values of the encoding algorithm allow the decoder to better adapt to transmission errors or loss of data blocks by using the last received internal values as the best estimate of the corresponding internal values in the respective adaptive quantizing and prediction in the decoding algorithm. Hereby the digital input signal A_I can be reproduced at the decoder side with less artefacts in case of transmission errors and/or loss of data blocks.

Thus, such ADPCM encoding/decoding scheme provides a low rate of bits to be carried by the digital transmission system, and still it is possible for the decoder to reconstruct the input signal in a robust manner without severe artefacts when transmitted over an imperfect wireless transmission system.

Figure 2:
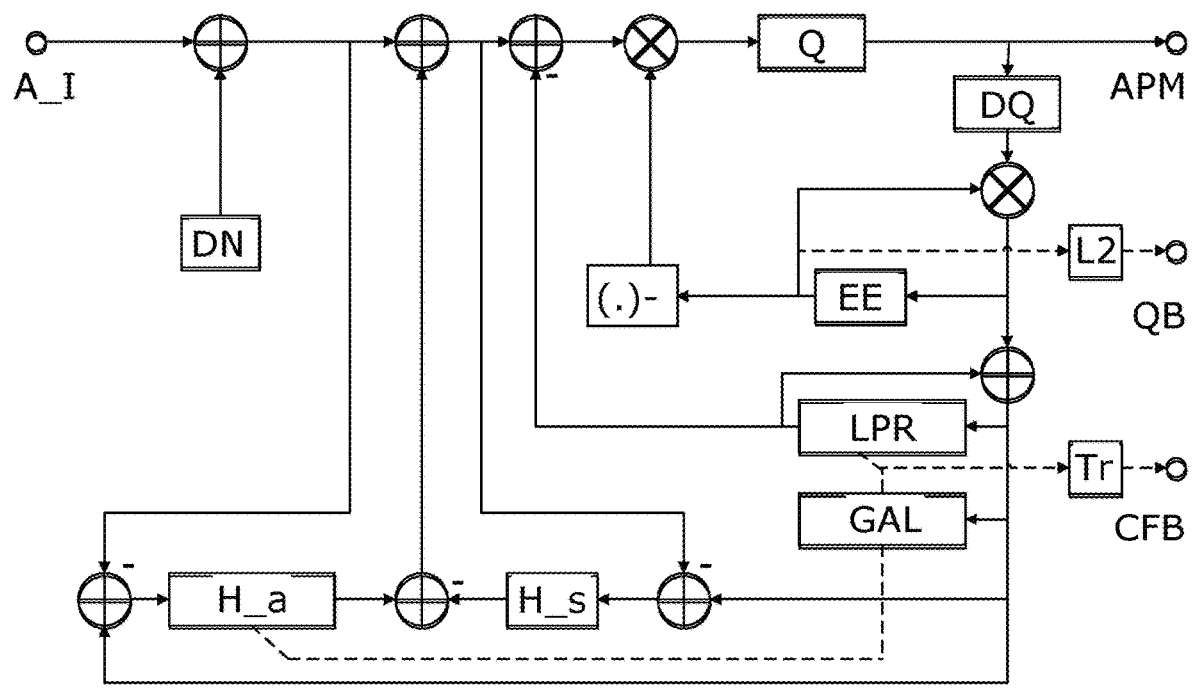
FIG. 2 illustrates an encoding algorithm embodiment.

FIG. 2 shows a specific encoder embodiment having four major components: an adaptive quantizer, an adaptive inverse quantizer, a predictor and noise shaping filter. The specific encoder is suited for encoding high quality digital audio input signals A_I, e.g. 24 bit at 48 kHz sample frequency. However, it is to be understood that the design can be used for other input signals as well.

The adaptive quantizer outputs the difference between the encoder input signal and output of the predictor LPR. This difference is quantized in the quantizer Q and reduced to lower bit rate for transfer in the transmission system, i.e. the ADPCM data bits APM. The same low bit rate data is also fed to the adaptive inverse quantizer, a de-quantize codebook DQ. The output of the inverse quantizer is fed back and added to the output of the predictor. The sum of these two signals constitutes a reconstruction of the input signal, which is fed in to the predictor for processing of the next input signal. The adaptive quantizer and adaptive inverse quantizer has an adaptive scaling value and a codebook DQ for lookup and quantization. The adaptive scaling value is a filtered estimation of inverse quantizer output envelope, i.e. an output from an envelope estimator EE. Different codebook DQ size can be used depending in required encoding bit rate and quality. The codebook preferably has 2 to 16 entries, corresponding to different encoding ratios of audio samples into from 1 to 4 bits.

Apart from the ADPCM data bits APM, the adaptive inverse quantization scaling factor used in the adaptive quantization, i.e. the output from the envelope estimator EE, is coded by an encoder L2 using a log 2 and further truncated. This encoded and truncated scaling factor QB from the adaptive quantization part of the ADPCM encoding algorithm is then output into the output stream along with the ADPCM data bits APM, e.g. in a header part of a data block. This internal data QB may be such as 4-16 bits, and e.g. 8 bits has been suitable for high quality audio signals.

The predictor comprises an adaptive filter LPR of lattice FIR type that models the deterministic part of the audio signal. The FIR filter LPR can have e.g. 2-40 taps, such as 8-20 taps, in a specific embodiment it has 13 taps. The FIR filter LPR may be implemented with progressive tap leak-age. The adaptation is performed by use of the Gradient Adaptive Lattice algorithm GAL. The output of the predictor is feed back and subtracted from the input to the adaptive quantizer. Hence, ideally the low bit rate output of the adaptive quantizer just contains the non-deterministic part of the audio signal. The difference between the input signal and the reconstructed signal is the coding error introduces by the coding scheme.

When the predictor filter LPR has adapted to the audio signal, the coding error will be nearly white noise. This coding error is fed back to the encoder input by an additional filter for spectral shaping of the coding noise to reduce audibility. This, so called noise shaping filter, has a static part H_s and an adaptive part H_a. The static filter H_s shifts noise energy from lower part to the upper part of the spectrum and the adaptive filter H_a shapes the spectrum of the noise to become similar as the spectrum of input signal. The filter coefficients in the adaptive part H_a of this noise shaping filter are derived from the predictor adaptive filter LPR, which represent the spectrum of the reconstructed audio signal.

In addition to the additional internal value QB from the adaptive quantization part of the ADPCM encoding algorithm, further internal data are included in the data stream from the encoder, namely data CFB representing the FIR filter coefficients of the prediction filter LPR. To limit bandwidth required for these data, the coefficients are truncated Tr, and they may be transferred sequentially, e.g. one coefficient per data block, thus transferring the FIR filter coefficients in a multiplexed manner, ensuring that a filter of length X can be completely transferred by means of X or more consecutive data blocks. Thus, in the specific encoding embodiment, one data block includes the internal value QB from the adaptive quantization as well as one FIR coefficient CFB from the lattice prediction FIR filter LPR. The coefficients are typically truncated Tr to the 4-12 most significant bits. Truncating to the 8 most significant bits is possible for a lattice FIR filter type LPR without losing too much accuracy.

A weak white noise dithering signal DN is added to the input signal A_I prior to further processing in the encoding algorithm to ensure proper and linear behaviour of the encoder, when encoder calculations are implemented with finite accuracy, such as fixed point implementation.

The encoding/decoding can be configured and used with different packet size and overhead ratio. Different codebook size for compression into 4, 3.6, 3.33, 3, 2.6, 2 or 1.66 bits per sample can be obtained.

Figures 3, 4:
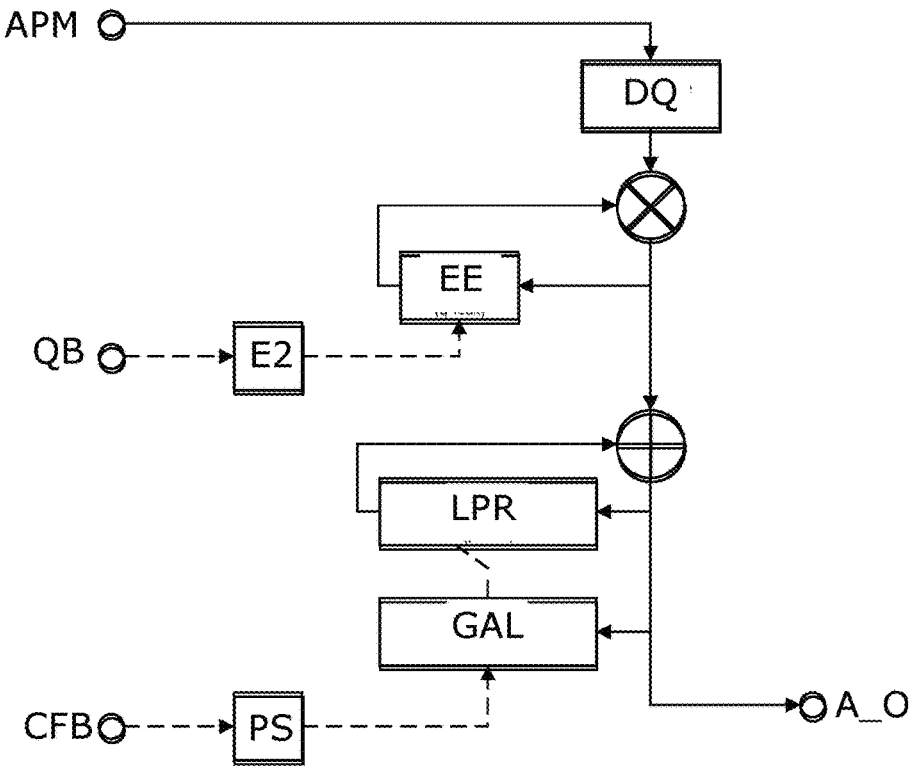
FIG. 3 illustrates a decoding algorithm embodiment.
FIG. 4 illustrates an example of a digital data block format.

FIG. 3 illustrates a decoding algorithm matching the encoding algorithm of FIG. 2, and thus being arranged to receive data blocks including the data QB, CFB and APM from the encoder and to generate a reconstructed output signal A_O accordingly. Of course, the decoder is arranged to decode the QB data by decoding E2 (i.e. exp2 decoding) the data QB to arrive at the scaling factor as input to the envelope estimator EE. Further, the single FIR filter coefficients are sequentially processed PS as input to the prediction lattice FIR filter LPR.

The decoding algorithm comprises an adaptive inverse quantizer and a predictor. The incoming low rate bits APM are fed to the adaptive inverse quantizer, which output is added to the predictor output in the same way as in the encoder. This sum constitutes the reconstructed output signal from the decoder and it is fed to the predictor for decoding of next audio sample.

As the adaptive inverse quantizer in the encoder and in the decoder are operating on the same sequence of low bit rate data APM, they will output the same signal and the predictor adaptive filter LPR in encoder and decoder will also produce the same signal and the signal and the reconstructed signal in encoder and decoder will be the same.

If assuming same start conditions and no transmission errors from encoder to decoder, all the internal states and produced signals from the inverse adaptive quantizer and predictor will be the same in encoder and decoder. However, if the encoder and decoder are started from different states, or transmission errors have occurred, the adaptive inverse quantizer and predictor in encoder and decoder will not have the same states and will not produce the same reconstructed signals. Due to the feedback from the predictor, the differences will continue for all following samples. In order to ensure the reconstructed signal in decoder converges to the corresponding signal in the encoder, leakages are added in the adaptation algorithms in both encoder and decoder. The adaptive inverse quantizer is added a small bias toward a common scaling value. In the predictor adaptive filter, it is possible to introduce scaling factors smaller than 1 in the adaptation algorithm GAL. The introduction of leakage reduces the prediction accuracy of the predictor and increases the coding errors and degrade the performance of encoder and decoder. Larger leakage reduces the time after transmission error until the decoder output has converged the encoder input signal, but it also increases the coding error. Usage of smaller leakage is desirable in order to avoid deteriorating the audio quality too much. However, small leakage increases the time after data loss until the output audio has recovered. Even quantization effects by finite word length implementations can cause limit cycle instabilities and un-linearity when smaller leakages are used.

To compensate for desirable usage of small leakage, the additional data QB, CFB giving information about important states of the adaptive inverse quantizer and the adaptive filter in the predictor can be used. The important states are the scaling factor used in the adaptive inverse quantizer and the filter coefficients in the lattice FIR filter LPR in the predictor. Thus, with these data encoded in QB and in CFB available in the data stream, it is possible to reduce the mentioned leakage, thereby increasing performance of the codec.

FIG. 4 shows an example of data blocks to be transmitted over a wireless link. Each block of ADPCM data has a header that has an encoded (log 2) and truncated version of a scaling factor being an internal value of the adaptive quantization in the encoder, e.g. having a length of 8 bits. Further, one coefficient Coef[x] of truncated predictor FIR filter coefficient is added in the header, e.g. truncated to the 8 most significant bits. The truncated coefficients Coef[x] are typically appended sequentially, one for each data block. After several data blocks all the truncated filter coefficients, e.g. 13, have been transferred. Altogether, the truncated scaling factor of the adaptive quantizer, truncated coefficient and low bit rate data, are sent in data blocks or packets, which also includes integrity check information, such as for example CRC. The truncated adaptive quantizer scaling factor and coefficients information represent the values of the states before processing the ADPCM data by the decoder.

A wireless data receiver can check the integrity of received data packets. If there are errors in the data packet, the adaptive inverse quantizer DQ is instructed to produce zero output. In such case the reconstructed output signal is the same as the output of the predictor. Additionally, the leakage in the predictor may be removed during the period of lost data to minimize the effect of lost data packet on the decode output.

When data packets are received error free by the wireless receiver, the truncated quantizer scaling factor and filter coefficients are presented to the decoder. If the decoder's internal state values of adaptive inverse quantizer scaling value and predictor filter coefficients differs more that their resolution defined by the truncation, then the state values are set to values indicated by the truncated values, i.e. based on the QB, CFB data, before the decoding processing starts. This approach ensures that adaptive inverse quantize is using a scaling value very close the value used by the encoder when low bit rate data were produced. This is important to avoid very audible clicks when data are received after series of lost data packets, as well as the decoded audio can be recovered quickly. Likewise, setting the predictor filter coefficients, ensures faster adaptation after loss data has ended. Thus, the decoding algorithm preferably comprises comparing its current internal values the received matching additional data QB, CFB received, and to adjust its internal values, if a difference of more than a predetermined threshold is detected.

This approach also has the benefit that additional functionality for soft mute and unmute for handling loss of data packets are usually not needed.

Figure 5:
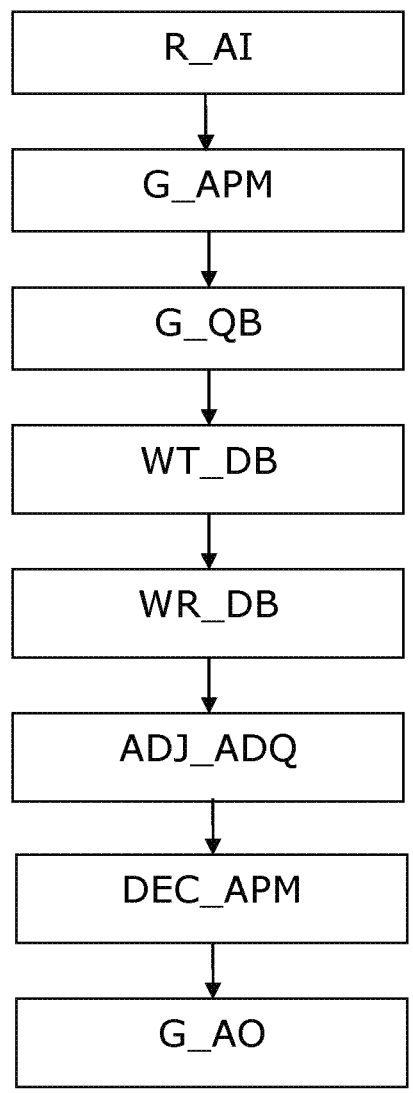
FIG. 5 illustrates steps of a wireless audio signal transmission embodiment.

FIG. 5 illustrates steps of a method embodiment for transferring a digital audio signal. The method comprises receiving the digital audio signal R_AI. The audio signal is then encoded by an ADPCM encoding algorithm and generating G_APM as a result ADPCM encoded bits. Further, the method comprises generating G_QB data bits indicative of an internal value, e.g. a scaling value, of the adaptive quantization part of the ADPCM encoding algorithm. Next, step is to wirelessly transmit WT_DB a data block including both the ADPCM encoded bits and the data bits indicative of the internal value of the adaptive quantization part of the ADPCM encoding algorithm. Next, the datablock is received by a wireless receiver WR_DB. At the decoder side, next step is to adjust ADJ_ADQ the scaling factor of the adaptive quantization of the ADPCM decoding algorithm in response to the data bits indicative of an internal value, e.g. a scaling value, of the adaptive quantization part of the ADPCM encoding algorithm, if the current corresponding scaling factor value in the decoder differs more than a predetermined threshold from the received scaling value, e.g. in case of lost data blocks. Next is to decode DEC_APM the received ADPCM data bits to run the decoding algorithm and generate G_AO an audio output signal accordingly.

To sum up, the invention provides an audio codec suitable for robust wireless transmission of high quality audio with low latency, still at a moderate bit rate. The encoding and decoding methods are based on ADPCM and in addition to the encoded output bits APM, additional data QB are included in output data blocks, namely data QB representing an internal value of the adaptive quantization ADQ of the ADPCM encoding algorithm, especially a scaling factor encoded and truncated to such as 8 bits. Further, output data blocks preferably include data CFB representing an internal value of the predictor PR of the ADPCM encoding algorithm, especially data CFB representing coefficients of a lattice prediction FIR filter which, truncated to such as 8 bits, can be sequentially included in output data blocks. These additional data QB, CFB regarding internal values of the ADPCM encoding algorithm can be utilized at the encoder side to increase robustness against loss of data blocks in wireless transmission. Especially, the decoding algorithm may comprise comparing its current internal ADPCM decoding values corresponding to the received internal values QB, CFB from the encoder, and in case there is a difference, the decoder can adapt or overwrite its internal values to the ones received QB, CFB. This helps to ensure fast recovery after lost data blocks, thereby ensuring robustness against artefacts in the reconstructed signal, e.g. clicks in case of audio.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method, executed by a processor, for decoding an Adaptive Differential Pulse Code Modulation encoded digital signal according to an Adaptive Differential Pulse Code Modulation decoding algorithm involving adaptive quantization according to a quantizer and a prediction according to a predictor, the method comprising:

receiving a digital data block comprising at least one data bit representing a first internal value, representing a scale factor, of an adaptive quantization, and at least one data bit representing a second internal value, representing a predictor state involved in an Adaptive Differential Pulse Code Modulation encoding algorithm, and Adaptive Differential Pulse Code Modulation data bits, adjusting a first current internal value, representing a current scale factor, of the adaptive quantization and a second current internal value, representing a predictor state involved in the Adaptive Differential Pulse Code Modulation decoding algorithm in accordance with the received at least one data bit representing the first internal value of the adaptive quantization, and the received at least one data bit representing the second internal value representing the predictor state involved in an Adaptive Differential Pulse Code Modulation encoding algorithm, in case a difference of more than a predetermined threshold between the first current internal value and the received first internal value and between the second current internal value and received second internal value, respectively, represented by the at least one data bit is detected, and generating a digital output signal by decoding the received Adaptive Differential Pulse Code Modulation data bits using the adjusted first current internal value and the adjusted second current internal value.

2. The method according to claim 1, comprising receiving a wireless radio frequency signal with the digital data block represented therein, and detecting if the data block has been received with an error.

3. The method according to claim 2, comprising setting an output of an adaptive inverse quantizer involved in the adaptive quantization to zero, if it is detected that the data block has been received with an error.

4. The method according to claim 2, comprising adjusting a leakage in the predictor or setting the leakage to zero in the predictor, if it is detected that the data block has been received with an error.

5. A decoder device comprising a decoder arranged to decode a received digital data block in accordance with the method according to claim 1.

6. A system comprising an encoder device comprising an encoder arranged to encode a digital input signal and to generate a digital data block by applying an Adaptive Differential Pulse Code Modulation encoding algorithm to a time block of the digital input signal, the Adaptive Differential Pulse Code Modulation encoding algorithm involving adaptive quantization according to a quantizer and a prediction according to a predictor, and generating Adaptive Differential Pulse Code Modulation data bits accordingly, generating at least one data bit representing a first internal value, representing a scale factor, of the adaptive quantization, and at least one data bit representing a second internal value, representing a predictor state of the predictor, and generating a digital data block comprising said at least one data bit representing the first internal value of the adaptive quantization, said at least one data bit representing the second internal value, representing the predictor state, and the Adaptive Differential Pulse Code Modulation data bits, a wireless radio frequency transmitter arranged to transmit a radio frequency signal representing the digital data block generated by the encoder, a wireless radio frequency receiver arranged to receive the radio frequency signal representing the digital data block generated by the encoder, and a decoder device according to claim 5.

7. A non-transitory computer readable medium having instructions which, when executed, cause a computing device or system comprising the processor to perform the method according to claim 1.

* * * * *